(12) United States Patent
Chen et al.

(10) Patent No.: US 9,494,874 B2
(45) Date of Patent: Nov. 15, 2016

(54) METHOD AND APPARATUS FOR DESIGN OF A METROLOGY TARGET

(71) Applicant: ASML NETHERLANDS B.V., Veldhoven (NL)

(72) Inventors: Guangqing Chen, Fremont, CA (US); Jen-Shiang Wang, Sunnyvale, CA (US); Shufeng Bai, San Carlos, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 26 days.

(21) Appl. No.: 14/578,036

(22) Filed: Dec. 19, 2014

(65) Prior Publication Data

US 2015/0185626 A1    Jul. 2, 2015

Related U.S. Application Data

(60) Provisional application No. 61/921,817, filed on Dec. 30, 2013.

(51) Int. Cl.
*G03B 27/68* (2006.01)
*G03F 7/20* (2006.01)

(52) U.S. Cl.
CPC .......... *G03F 7/70633* (2013.01); *G03F 7/705* (2013.01); *G03F 7/70625* (2013.01); *G03F 7/70641* (2013.01); *G03F 7/70683* (2013.01)

(58) Field of Classification Search
CPC .................. G03F 7/70633; G03F 7/70641
USPC ............... 355/52, 53, 55, 77; 716/20, 53
See application file for complete search history.

(56) References Cited

U.S. PATENT DOCUMENTS

| | | | |
|---|---|---|---|
| 6,721,691 B2 | 4/2004 | Bao et al. | |
| 6,869,739 B1 | 3/2005 | Ausschnitt et al. | |
| 7,088,426 B2 | 8/2006 | Hirukawa et al. | |
| 7,200,455 B2 | 4/2007 | Schulze | |
| 7,587,704 B2 | 9/2009 | Ye et al. | |
| 7,791,732 B2 | 9/2010 | Den Boef et al. | |
| 7,873,504 B1 | 1/2011 | Bevis | |
| 2003/0046654 A1 | 3/2003 | Bodendorf et al. | |
| 2004/0223157 A1 | 11/2004 | Nakajima | |
| 2005/0240895 A1* | 10/2005 | Smith ..................... | G03F 7/705 700/121 |
| 2006/0066855 A1 | 3/2006 | Boef et al. | |
| 2007/0050749 A1* | 3/2007 | Ye ............................ | G03F 1/14 430/30 |
| 2007/0276634 A1 | 11/2007 | Smith et al. | |
| 2008/0094639 A1 | 4/2008 | Widmann et al. | |
| 2009/0073406 A1 | 3/2009 | Finders et al. | |
| 2009/0276751 A1 | 11/2009 | Cao et al. | |

(Continued)

FOREIGN PATENT DOCUMENTS

WO   WO 2010/054350   5/2010
WO   WO 2014/138057   9/2014

*Primary Examiner* — Hung Henry Nguyen
(74) *Attorney, Agent, or Firm* — Pillsbury Winthrop Shaw Pittman LLP

(57) ABSTRACT

A system to, and a method to, select a metrology target for use on a substrate including performing a lithographic simulation for a plurality of points on a process window region for each proposed target, identifying a catastrophic error for any of the plurality of points for each proposed target, eliminating each target having a catastrophic error at any of the plurality of points, performing a metrology simulation to determine a parameter over the process window for each target not having a catastrophic error at any of the plurality of points, and using the one or more resulting determined simulated parameters to evaluate target quality.

18 Claims, 6 Drawing Sheets

(56) References Cited

U.S. PATENT DOCUMENTS

| | | |
|---|---|---|
| 2010/0174033 A1 | 7/2010 | Crawford et al. |
| 2011/0154272 A1 | 6/2011 | Hsu et al. |
| 2013/0014065 A1 | 1/2013 | Feng et al. |
| 2013/0232457 A1 | 9/2013 | Ye et al. |
| 2013/0282340 A1 | 10/2013 | Liu et al. |
| 2013/0304408 A1 | 11/2013 | Pandev |
| 2013/0308142 A1 | 11/2013 | Straaijer |
| 2014/0208278 A1 | 7/2014 | Cao et al. |

* cited by examiner

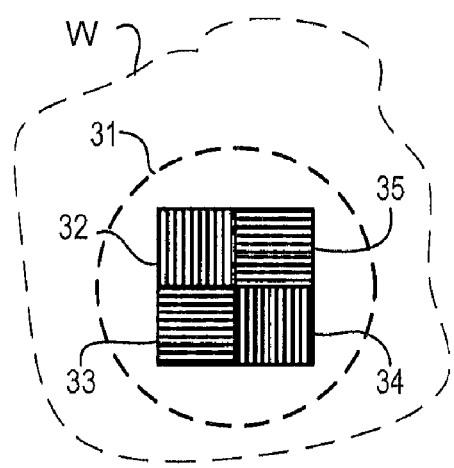
Fig. 5
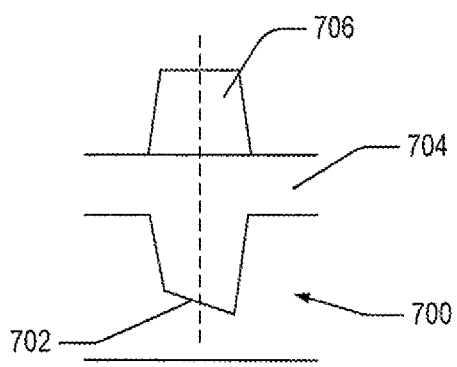
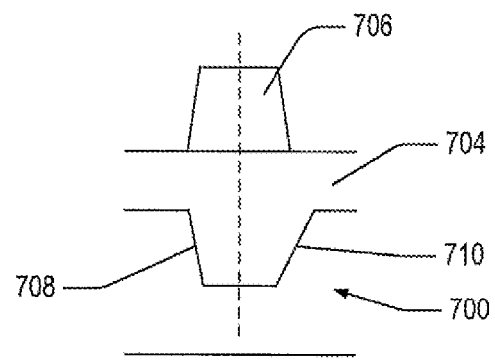
Fig. 6A          Fig. 6B

METHOD AND APPARATUS FOR DESIGN OF A METROLOGY TARGET

CROSS-REFERENCE TO RELATED APPLICATIONS

This application claims the benefit under 35 USC 119(e) of prior co-pending U.S. Provisional Patent Application No. 61/921,817, filed Dec. 30, 2013, the disclosure of which is hereby incorporated by reference in its entirety.

FIELD

The present description relates to methods and apparatus to determine one or more structural parameters of a metrology target usable, for example, in the manufacture of devices by a lithographic technique and to methods of manufacturing using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable to frequently make measurements of the structures created, e.g., for process control and verification. One or more parameters of the structures are typically measured or determined, for example the overlay error between successive layers formed in or on the substrate. There are various techniques for making measurements of the microscopic structures formed in a lithographic process. Various tools for making such measurements are known, including scanning electron microscopes, which are often used to measure critical dimension (CD), and specialized tools to measure overlay, the accuracy of alignment of two layers in a device. An example of such a tool is a scatterometer developed for use in the lithographic field. This device directs a beam of radiation onto a target on the surface of the substrate and measures one or more properties of the redirected radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods, library searches, and principal component analysis.

SUMMARY

It is desirable, for example, to provide methods and apparatus to design, locate and/or select marks for use as a metrology target. Furthermore, although not limited to this, such methods that allow for improved discrimination of the value of targets may be advantageous compared with discriminating the value of a target based on substrate CD change thresholding.

In an aspect, there is provided a method of selecting a metrology target for use on a substrate, the method comprising: performing a lithographic simulation for a plurality of points on a process window region for a proposed metrology target; performing a metrology simulation to determine a value for a parameter over the process window for the proposed metrology target if the proposed metrology target does not have a catastrophic error at any of the plurality of points; and using the resulting determined simulated parameter value to evaluate target quality.

In an aspect, there is provided a non-transitory computer readable medium encoded with machine executable instructions to perform a method of selecting a metrology target for use on a substrate, the method comprising: performing a lithographic simulation for a plurality of points on a process window region for a proposed metrology target; performing a metrology simulation to determine a value for a parameter over the process window for the proposed metrology target if the proposed metrology target does not have a catastrophic error at any of the plurality of points; and using the resulting determined simulated parameter value to evaluate target quality.

In an aspect, there is provided a system to select a metrology target for use on a substrate, the system comprising: a processing unit configured and arranged to: perform a lithographic simulation for a plurality of points on a process window region for a proposed metrology target; perform a metrology simulation to determine a value for a parameter over the process window for the proposed metrology target if the proposed metrology target does not have a catastrophic error at any of the plurality of points; and use the resulting determined simulated parameter value to evaluate target quality.

In an aspect, there is provided a method, comprising: evaluating a plurality of metrology target designs at a plurality of points of a lithographic process window for a catastrophic error; for a plurality of metrology target designs that are evaluated not to suffer a catastrophic error at any of the plurality of points, determining a metrology performance indicator for each of the plurality of metrology target designs evaluated not to suffer a catastrophic error; and providing an evaluation of the plurality of metrology target designs evaluated not to suffer a catastrophic error based on the metrology performance indicator.

BRIEF DESCRIPTION OF THE DRAWINGS

Embodiments will now be described, by way of example only, with reference to the accompanying drawings in which:

FIG. 5 schematically depicts a form of multiple grating target and an outline of a measurement spot on a substrate;

FIGS. 6A and 6B schematically depict a model structure of one period of an overlay target showing an example of variation of the target from ideal, e.g., two types of process-induced asymmetry;

DETAILED DESCRIPTION

Before describing embodiments in detail, it is instructive to present an example environment in which embodiments may be implemented.

Figure 1:
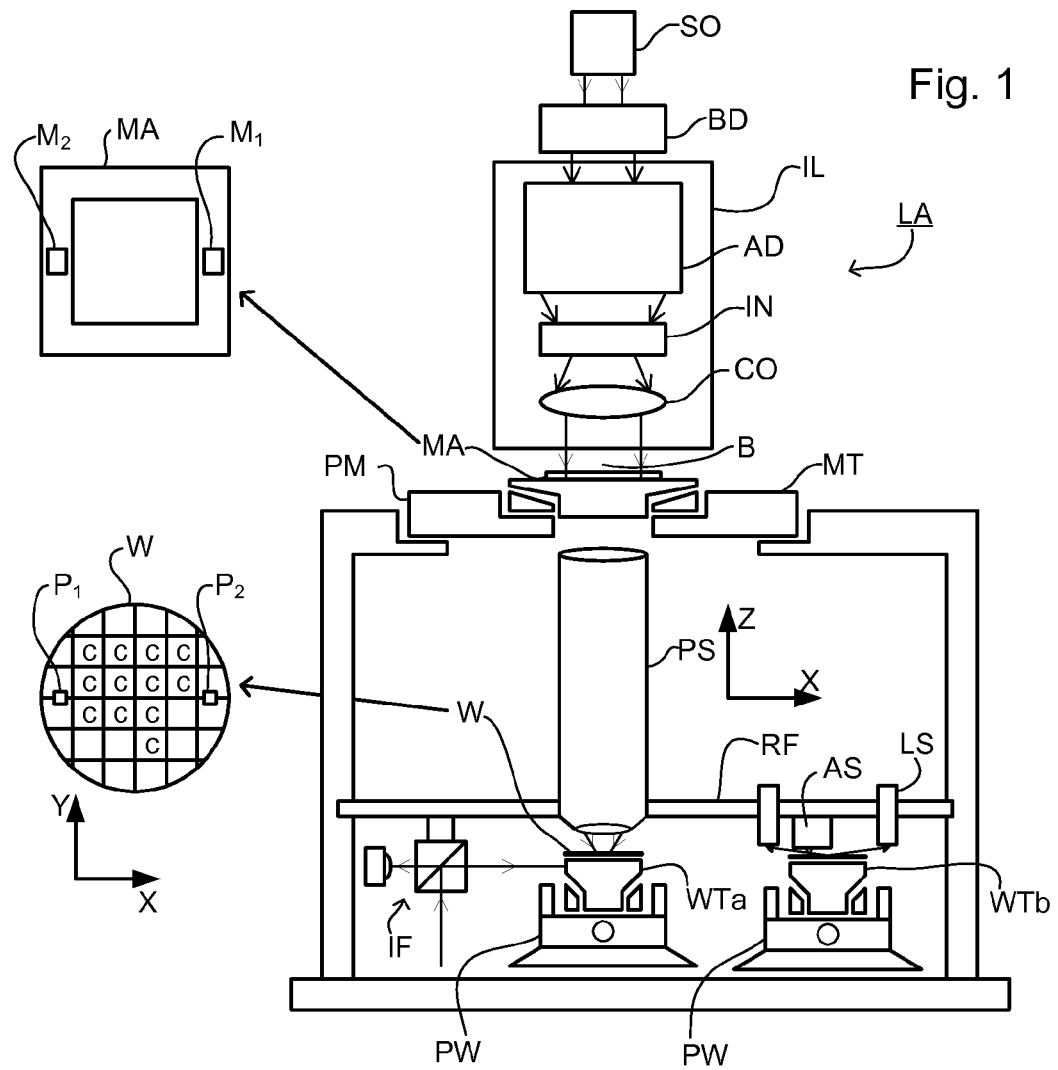
FIG. 1 schematically depicts an embodiment of a lithographic apparatus.

FIG. 1 schematically depicts a lithographic apparatus LA. The apparatus comprises:
- an illumination system (illuminator) IL configured to condition a radiation beam B (e.g., DUV radiation or EUV radiation);
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WTa constructed to hold a substrate (e.g., a resist-coated wafer) W and connected to a second positioner PW configured to accurately position the substrate in accordance with certain parameters; and
- a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
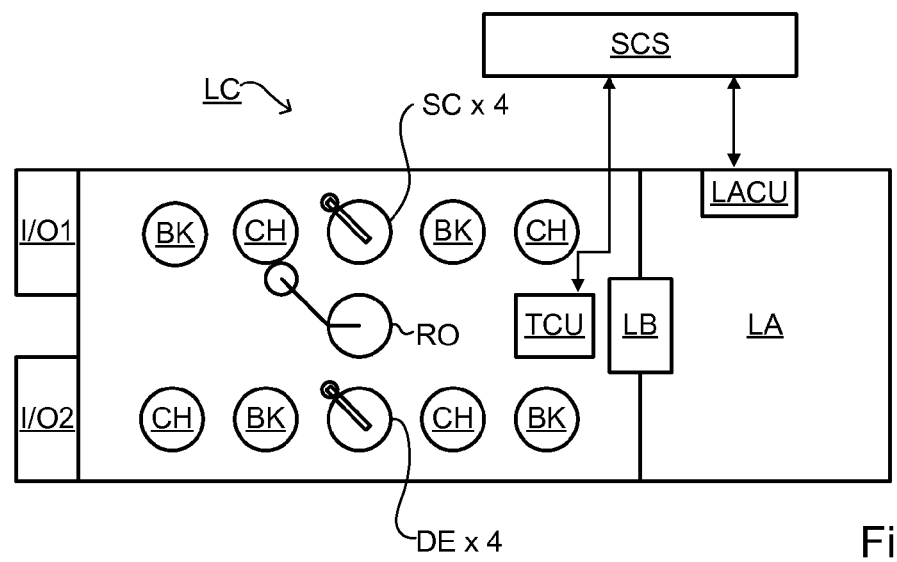
FIG. 2 schematically depicts an embodiment of a lithographic cell or cluster.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, 1/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g., the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g., for the purpose of process control.

Figure 3:
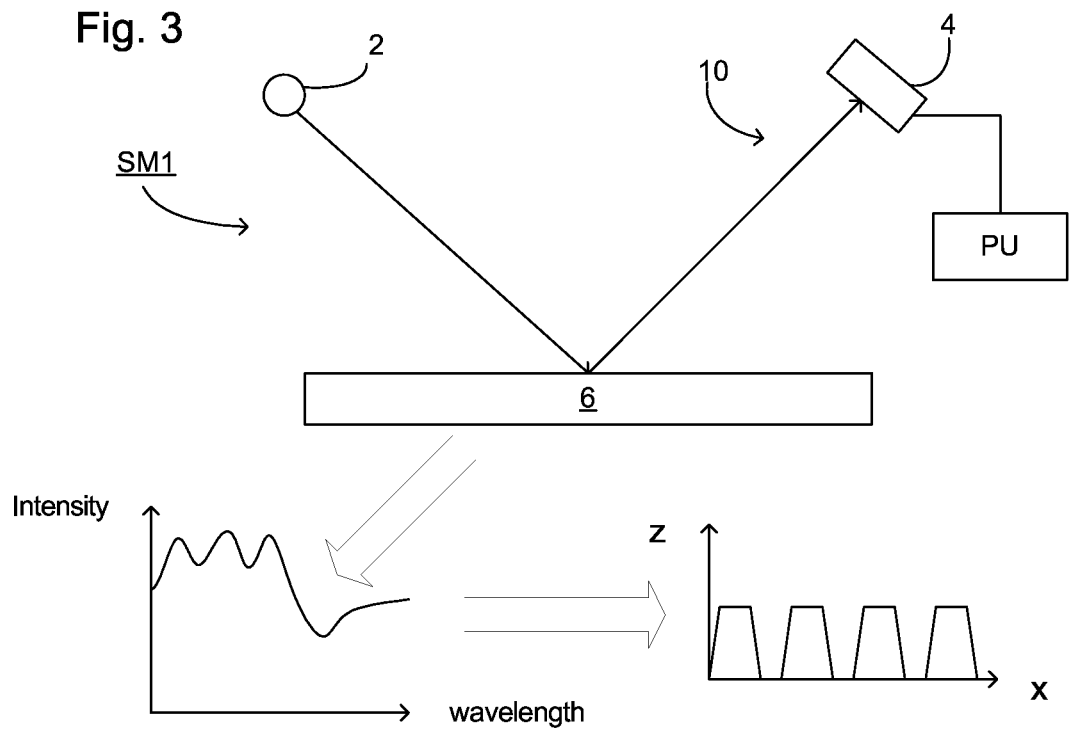
FIG. 3 schematically depicts an embodiment of a scatterometer.

FIG. 3 depicts an embodiment of a scatterometer SM1. It comprises a broadband (white light) radiation projector 2 which projects radiation onto a substrate 6. The reflected radiation is passed to a spectrometer detector 4, which measures a spectrum 10 (i.e., a measurement of intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
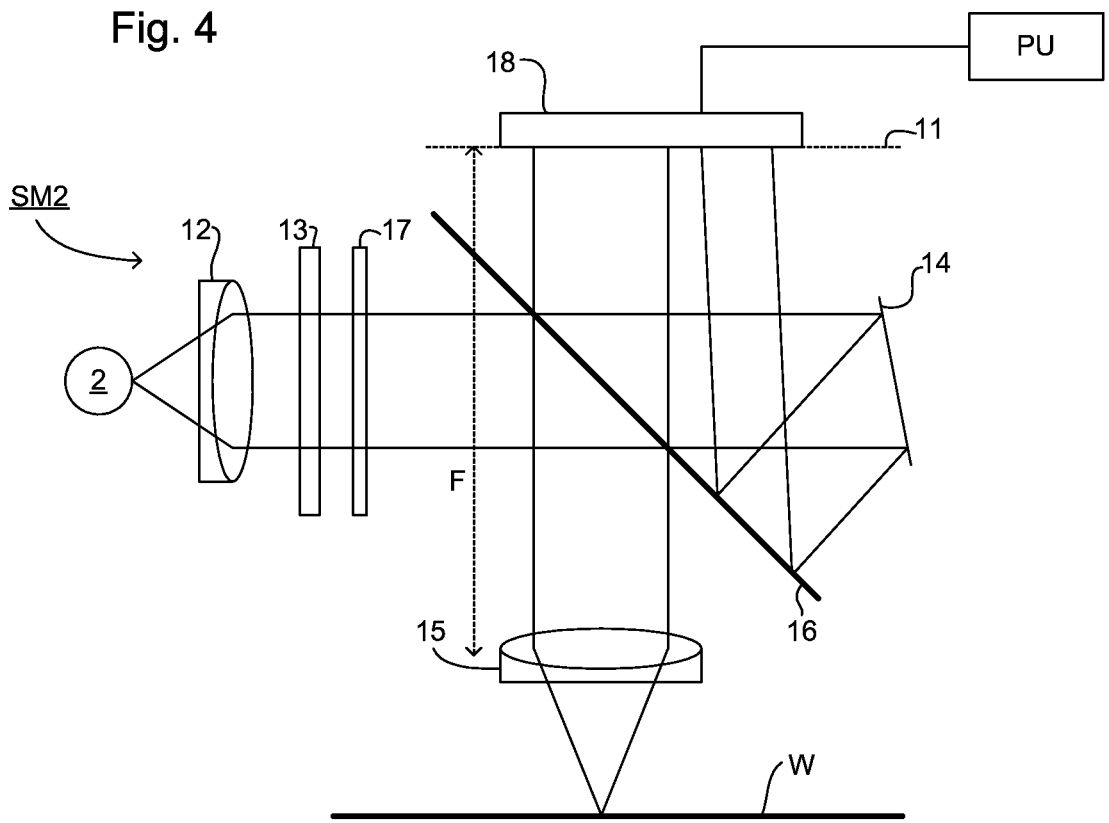
FIG. 4 schematically depicts a further embodiment of a scatterometer.

Another embodiment of a scatterometer SM2 is shown in FIG. 4. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is desirably a two-dimensional detector so that a two-dimensional angular scatter spectrum (i.e., a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered radiation at a single wavelength (or narrow wavelength range), the intensity separately at multiple wavelengths or the intensity integrated over a wavelength range. Further, the detector may separately measure the intensity of transverse magnetic—(TM) and transverse electric—(TE) polarized radiation and/or the phase difference between the transverse magnetic- and transverse electric-polarized radiation.

Using a broadband radiation source 2 (i.e., one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least 2 $\delta\lambda$ (i.e., twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. Patent Application Publication No. US 2006-0066855, which document is hereby incorporated in its entirety by reference.

By comparing one or more properties of the beam before and after it has been redirected by the target, one or more properties of the substrate may be determined. This may be done, for example, by comparing the redirected beam with theoretical redirected beams calculated using a model of the substrate and searching for the model that gives the best fit between measured and calculated redirected beams. Typically a parameterized generic model is used and the parameters of the model, for example width, height and sidewall angle of the pattern, are varied until the best match is obtained.

Two main types of scatterometer are used. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity (or intensity ratio and phase difference in case of an ellipsometric configuration) of the scattered radiation as a function of angle. Alternatively, measurement signals of different wavelengths may be measured separately and combined at an analysis stage. Polarized radiation may be used to generate more than one spectrum from the same substrate.

In order to determine one or more parameters of the substrate, a best match is typically found between the theoretical spectrum produced from a model of the substrate and the measured spectrum produced by the redirected beam as a function of either wavelength (spectroscopic scatterometer) or angle (angularly resolved scatterometer). To find the best match there are various methods, which may be combined. For example, a first method is an iterative search method, where a first set of model parameters is used to calculate a first spectrum, a comparison being made with the measured spectrum. Then a second set of model parameters is selected, a second spectrum is calculated and a comparison of the second spectrum is made with the measured spectrum. These steps are repeated with the goal of finding the set of parameters that gives the best matching spectrum. Typically, the information from the comparison is used to steer the selection of the subsequent set of parameters. This process is known as an iterative search technique. The model with the set of parameters that gives the best match is considered to be the best description of the measured substrate.

A second method is to make a library of spectra, each spectrum corresponding to a specific set of model parameters. Typically the sets of model parameters are chosen to cover all or almost all possible variations of substrate properties. The measured spectrum is compared to the spectra in the library. Similarly to the iterative search method, the model with the set of parameters corresponding to the spectrum that gives the best match is considered to be the best description of the measured substrate. Interpolation techniques may be used to determine more accurately the best set of parameters in this library search technique.

In any method, sufficient data points (wavelengths and/or angles) in the calculated spectrum should be used in order to enable an accurate match, typically between 80 up to 800 data points or more for each spectrum. Using an iterative method, each iteration for each parameter value would involve calculation at 80 or more data points. This is multiplied by the number of iterations needed to obtain the correct profile parameters. Thus many calculations may be required. In practice this leads to a compromise between accuracy and speed of processing. In the library approach, there is a similar compromise between accuracy and the time required to set up the library.

In any of the scatterometers described above, the target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit PU, from knowledge of the printing step and/or other scatterometry processes. Lines in targets may be made up of sub-units, including near or sub-resolution features that together define lines of the gratings, such as are described in U.S. patent application Ser. No. 12/265,072, herein incorporated by reference.

While embodiments of a scatterometer have been described herein, other types of metrology apparatus may be used in an embodiment. For example, a dark field metrology apparatus such as described in U.S. Patent Application Publication No. 2013-0308142, which is incorporated herein in its entirety by reference, may be used. Further, those other types of metrology apparatus may use a completely different technique than scatterometry.

The metrology targets as described herein may be, for example, overlay targets designed for use with a metrology tool such as Yieldstar stand-alone or integrated metrology tool, and/or alignment targets such as those typically used with a TwinScan lithographic system, both available from ASML.

In general, metrology targets for use with such systems should be printed on the substrate with dimensions that meet the design specification for the particular microelectronic device to be imaged on that substrate. As processes continue to push against the limits of lithographic device imaging resolution in advanced process nodes, the design rule and process compatibility requirements place stress on the selection of appropriate targets. As the targets themselves become more advanced, often requiring the use of resolution enhancement technology, such as phase-shift patterning devices, and optical proximity correction, the printability of the target within the process design rules becomes less certain. As a result, proposed metrology target design may be subject to testing and/or simulation in order to confirm their suitability and/or viability, both from a printability and a detectability standpoint. In a commercial environment, good overlay mark detectability may be considered to be a combination of low total measurement uncertainty as well as a short move-acquire-move time, as slow acquisition is detrimental to total throughput for the production line. Modern micro-diffraction-based-overlay targets (µDBO) may be on the order of 10 µm on a side, which provides an inherently low detection signal compared to 40×160 µm$^2$ targets such as those used in the context of monitor substrates.

Additionally, once metrology targets that meet the above criteria have been selected, there is a possibility that detectability will change with respect to process variations, such as film thickness variation, various etch biases, and geometry asymmetries induced by the etch and/or polish processes. Therefore, it may be useful to select a target that has low detectability variation and low overlay/alignment variation against various process variations. Likewise, the fingerprint (printing characteristics, including, for example, lens aberration) of the specific machine that is to be used to produce the microelectronic device to be imaged will, in general, affect the imaging and production of the metrology targets. It may therefore be useful to ensure that the metrology targets are resistant to fingerprint effects, as some patterns will be more or less affected by a particular lithographic fingerprint.

FIG. 5 depicts a composite metrology target formed on a substrate according to known practice. The composite target comprises four gratings 32, 33, 34, 35 positioned closely together so that they will all be within a measurement spot 31 formed by the illumination beam of the metrology apparatus. The four targets thus are all simultaneously illuminated and simultaneously imaged on sensor 4, 18. In an example dedicated to overlay measurement, gratings 32, 33, 34, 35 are themselves composite gratings formed by overlying gratings that are patterned in different layers of the semi-conductor device formed on substrate W. Gratings 32, 33, 34, 35 may have differently biased overlay offsets in order to facilitate measurement of overlay between the layers in which the different parts of the composite gratings are formed. Gratings 32, 33, 34, 35 may also differ in their orientation, as shown, so as to diffract incoming radiation in X and Y directions. In one example, gratings 32 and 34 are X-direction gratings with biases of +d, −d, respectively. This means that grating 32 has its overlying components arranged so that if they were both printed exactly at their nominal locations, one of the components would be offset relative to the other by a distance d. Grating 34 has its components arranged so that if perfectly printed there should be an offset of d, but in the opposite direction to the first grating and so on. Gratings 33 and 35 may be Y-direction gratings with offsets +d and −d respectively. While four gratings are illustrated, another embodiment may include a larger matrix to obtain desired accuracy. For example, a 3×3 array of nine composite gratings may have biases −4d, −3d, −2d, −d, 0, +d, +2d, +3d, +4d. Separate images of these gratings can be identified in the image captured by sensor 4, 18.

FIGS. 6A and 6B schematically show a model structure of one period of an overlay target showing an example of variation of the target from ideal, e.g., two types of process-induced asymmetry. With reference to FIG. 6A, the substrate W is patterned with a bottom grating 700, etched into a substrate layer. The etch process used for the bottom grating results in a tilt of the floor 702 of the etched trench. This floor tilt, FT, can be represented as a structural parameter, for example as a measure of the height drop across the floor 702, in nm. A BARC (bottom anti-reflective coating) layer 704 supports the patterned resist feature of the top grating 706. In this example, the alignment overlay error between the top and bottom grating is zero, as the centers of the top and bottom grating features are at the same lateral position. However, the bottom-layer process-induced asymmetry, i.e., the floor tilt, leads to an error in the measured overlay offset, in this case giving a non-zero overlay offset. FIG. 6B shows another type of bottom-layer process-induced asymmetry that can lead to an error in the measured overlay offset. This is side wall angle (SWA) unbalance, SWAun. Features in common with those of FIG. 6A are labeled the same. Here, one side wall 708 of the bottom grating has a different slope to the other side wall 710. This unbalance can be represented as a structural parameter, for example as a ratio of the two side wall angles relative to the plane of the substrate. Both asymmetry parameters floor tilt and SWA unbalance give rise to an "apparent" overlay error between the top and bottom gratings. This apparent overlay error comes on top of the "real" overlay error to be measured between the top and bottom gratings.

Accordingly, in an embodiment, it is desirable to simulate various metrology target designs in order to confirm the suitability and/or viability of one or more of the proposed target designs.

Figure 7:
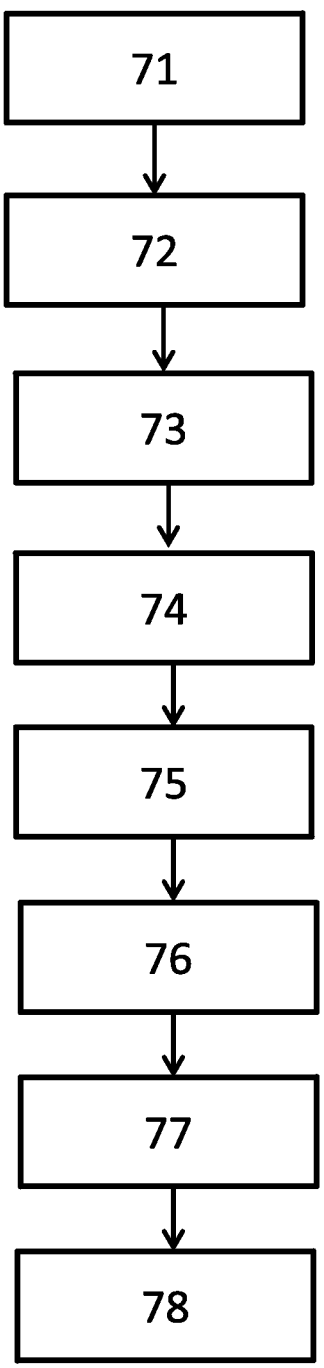
FIG. 7 is an exemplary block diagram illustrating the functional modules of a manufacturing process simulation model.

In a system for simulating a manufacturing process involving lithography and metrology targets, the major manufacturing system components and/or processes can be described by various functional modules, for example, as illustrated in FIG. 7. Referring to FIG. 7, the functional modules may include a design layout module 71, which defines a metrology target (and/or microelectronic device) design pattern; a patterning device layout module 72, which defines how the patterning device pattern is laid out in polygons based on the target design; a patterning device model module 73, which models the physical properties of the pixilated and continuous-tone patterning device to be utilized during the simulation process; an optical model module 74, which defines the performance of the optical components of the lithography system; a resist model module 75, which defines the performance of the resist being utilized in the given process; a process model module 76, which defines performance of the post-resist development processes (e.g., etch); and metrology module 77, which defines the performance of a metrology system used with the metrology target and thus the performance of the metrology target when used with the metrology system. The results of one or more of the simulation modules, for example, predicted contours and CDs, are provided in a result module 78.

The properties of the illumination and projection optics are captured in the optical model module 74 that includes, but is not limited to, NA-sigma ( ) settings as well as any particular illumination source shape, where (or sigma) is outer radial extent of the illuminator. The optical properties of the photo-resist layer coated on a substrate—i.e. refractive index, film thickness, propagation and polarization effects—may also be captured as part of the optical model module 74, whereas the resist model module 75 describes the effects of chemical processes which occur during resist exposure, post exposure bake (PEB) and development, in order to predict, for example, contours of resist features formed on the substrate. The patterning device model module 73 captures how the target design features are laid out in the pattern of the patterning device and may include a representation of detailed physical properties of the patterning device, as described, for example, in U.S. Pat. No. 7,587,704. The objective of the simulation is to accurately predict, for example, edge placements and critical dimensions (CDs), which can then be compared against the target design. The target design is generally defined as the pre-OPC patterning device layout, and will be provided in a standardized digital file format such as GDSII or OASIS.

In general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process. However, sometimes the model parameters may be inaccurate from measurement and reading errors, and there may be other imperfections in the system. With precise calibration of the model parameters, extremely accurate simulations can be done.

A metrology target design can be characterized by various parameters such as, for example, target coefficient (TC), stack sensitivity (SS), overlay impact (OV), or the like. Stack sensitivity can be understood as a measurement of how much the intensity of the signal changes as overlay changes because of diffraction between target (e.g., grating) layers. Target coefficient can be understood as a measurement of signal-to-noise ratio for a particular measurement time as a result of variations in photon collection by the measurement system. In an embodiment, the target coefficient can also be thought of as the ratio of stack sensitivity to photon noise; that is, the signal (i.e., the stack sensitivity) may be divided by a measurement of the photon noise to determine the target coefficient. Overlay impact measures the change in overlay error as a function of target design.

There is a desire to quickly but effectively qualify metrology targets. Prior methods have excluded potentially good metrology targets, where, for example, potential metrology targets are qualified based on a CD error threshold like that used to qualify product (device) patterns. For example, the amount of metrology target CD change that will cause significant deterioration of metrology target quality may depend on many factors such as target design, substrate layer stack, etc. So, using a CD change threshold (e.g., 10% CD) to filter out unsuitable metrology target designs could result in valid metrology targets being discarded. Thus, there is provided, in an embodiment, an approach of simulating a potential metrology target over the process window and continuing to simulate metrology performance for the potential metrology target if it has acceptable performance over the process window.

Figure 8:
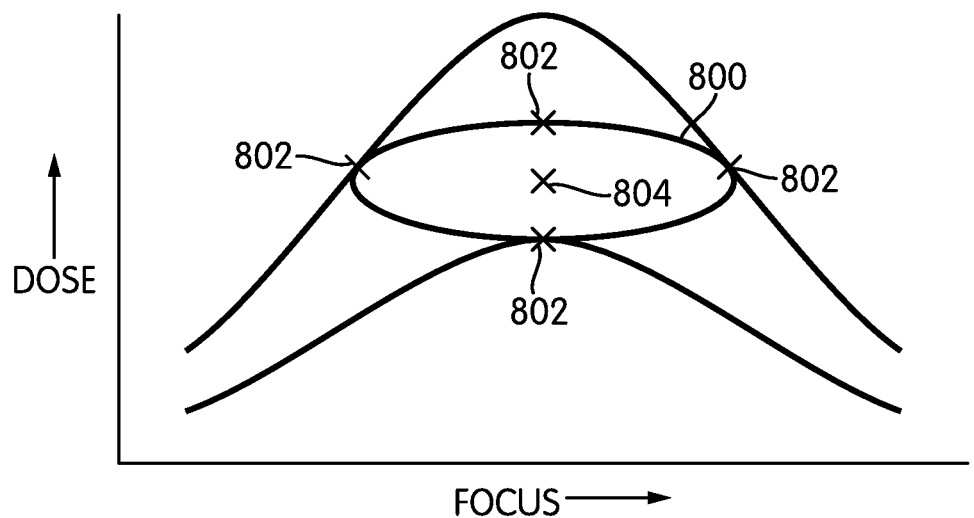
FIG. 8 illustrates an example of a process window (dose v. focus) in accordance with an embodiment.
Figure 9:
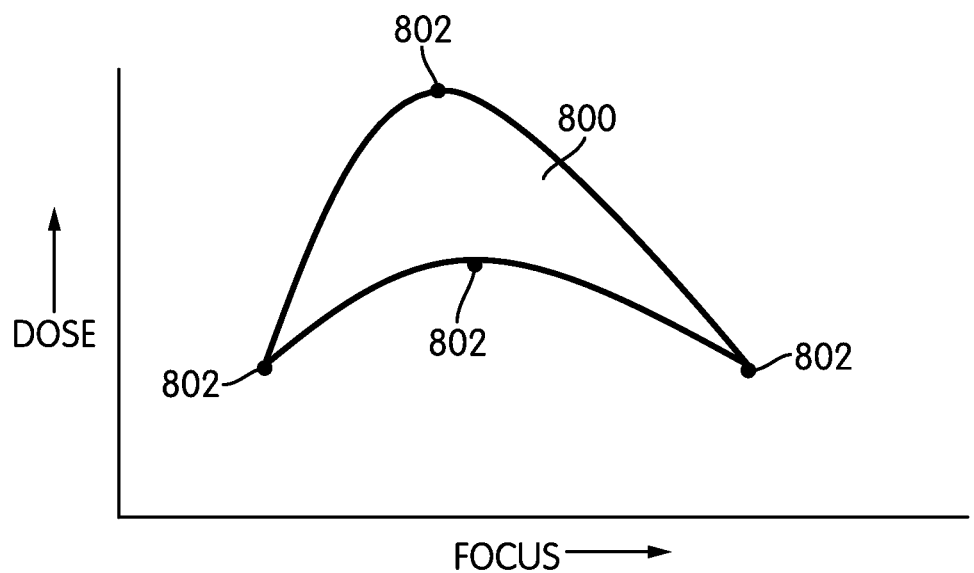
FIG. 9 illustrates a further example of a process window (dose v. focus) in accordance with an embodiment.

In an embodiment, a pattern to be imaged on a lithographic system has a process window 800 as illustrated, for example, in FIGS. 8 and 9. As illustrated, the process window 800 represents an interdependent relationship among dose, focus, and critical dimension, though there are other useful approaches to illustrating a process window in the context of lithography (e.g., using different parameters). In general, a process window can be understood to mean a set of parameters within which the lithographic process under consideration may be successfully performed, with adequate imaging characteristics for the intended purpose. As will be appreciated, the process window is generally dependent on the resolution of the imaging device, the characteristics of the resist on the substrate, the interactions between portions of the imaged pattern and OPC features, the type, position, and density of the features to be imaged, and other factors. The topography of features already placed on the substrate, multipath reflections from layers on the substrate surface, and lithographic apparatus fingerprint may also contribute to modeling of a process window for a given imaging operation. Typically, the process window will be defined by the product (e.g., electronic device) to be imaged, and more particularly to the specific layer under investigation. As will be appreciated, for a so-called critical layer, the process window may be much smaller than the process window for a different layer for the same product.

In a method in accordance with an embodiment, a lithographic simulation of the process of imaging an array of potential metrology target candidates is performed for a number of points 802, 804 on the process window. In this approach, typically many different configurations of metrology target from which the process designer is selecting will be simulated in the array. That is, each metrology target candidate in the array may have a different configuration with respect to (grating) line widths, (grating) line segmentation, (grating) pitch, and/or any other metrology target parameter that might be varied. Once the array of candidates is defined, the simulation may proceed.

In the illustrated embodiment, five points are selected, four "corners" 802 of the process window as well as one 804 that is considered to be in the center or in a central portion of the process window. In an embodiment, a different number of points of the process window may be selected and/or a different location of each of the points of the process window may be selected. Desirably, points at one or more maxima and/or minima are selected to provide broad coverage of the process window. For example, as shown in FIG. 9, four points 802 at "corners" of the process window may be selected. The process window may be, for example, user specified or simulated for a critical pattern of a product (device) pattern layout.

Thus, for each candidate metrology target, there are five (or however many points on the process window are used) corresponding simulated images (which may be denominated as $T_{i,n}$, i=1 . . . x, n=1 . . . 5, where i is a metrology target number for x total simulated metrology targets and n is the process window point). The lithographic simulation is performed taking into account the particular metrology target to be imaged, and may be, for example, simulated using an optical/resist model (e.g. modules 71-75 or modules 71-76 or some subset).

The results of the lithographic simulation are examined, and any metrology target candidate for which a catastrophic error in the target image is produced is discarded. Examples of catastrophic error include, for example, bridging, necking between lines, resist collapse, one or more extra lines, one or more missing lines, excessive top loss, minimum CD/space, etc. That is, catastrophic error can be considered to be any error that would cause a manufactured structure to fail for its intended purpose.

Figure 10A:
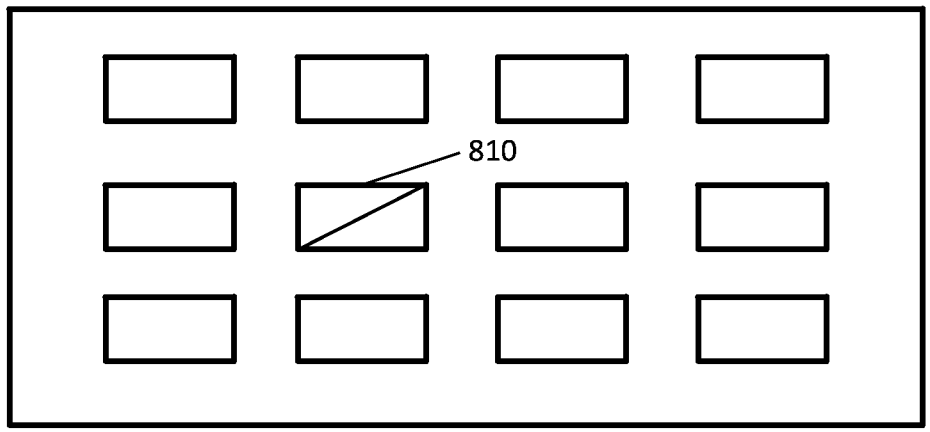
FIG. 10A illustrates a simulated array of metrology marks corresponding to a particular point on the process window.

FIG. 10A schematically illustrates the result of a lithographic simulation corresponding to a central point 804 on the process window. In the example schematic illustration, the majority of the proposed metrology targets are well-imaged in the simulation, with the exception of a single target 810 showing a catastrophic failure.

Figure 10B:
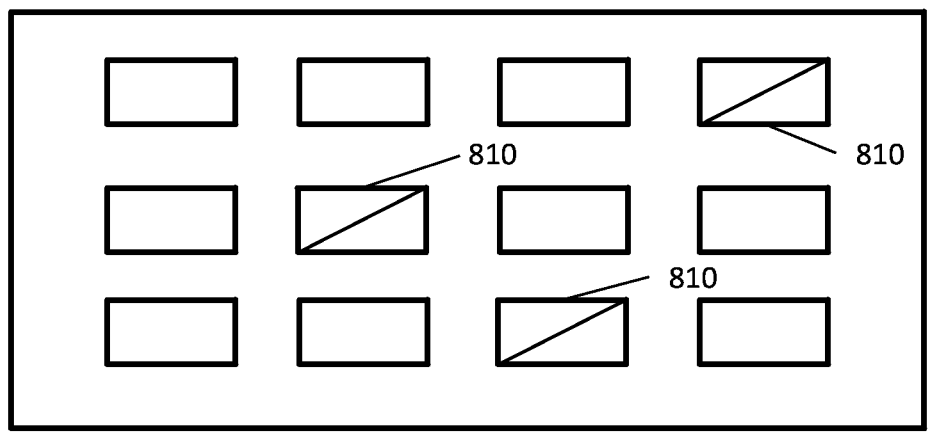
FIG. 10B illustrates a simulated array of metrology marks corresponding to a different point on the process window.

In contrast, FIG. 10B schematically illustrates the result of a lithographic simulation corresponding to one of the corner points 802 on the process window. More catastrophic failures 810 appear in FIG. 10B as a result of operating closer to the edge of the process window. Additional examples, corresponding to each of the additional corner points 802, may show the same or different amount and/or type of catastrophic failures.

For the one or more target candidates that do not show a catastrophic error, a metrology simulation is performed (e.g.

module 77). That is, the simulated targets resulting from the lithographic simulation from the various points in the process window that do not show a catastrophic error are used as the basis for a simulated metrology measurement. In the case that five points on the process window are simulated, this would mean that metrology simulation would be performed for five arrays of targets, excepting the simulated failed targets. This simulation for several points distributed in different areas of the process window can be considered to be simulating over the process window. By excepting the simulated failed targets is meant that no simulation is performed for any metrology target candidate that failed at at least one point in the process window; so, for a metrology target candidate that has shown a catastrophic error at one or more points on the process windows, no metrology simulations are performed for that metrology target candidate, even at process window points for which the metrology target candidate has not shown a catastrophic error.

The metrology simulation simulates the operation of an optical metrology tool, and in an embodiment, a diffraction-based overlay tool, as described above. In principle, the method may likewise be applied to one or more other optical (e.g., image-based or diffraction based) metrology tools.

The output of the metrology simulation is a simulated overlay measurement for all remaining potential targets at each process window condition. For each potential target, a parameter describing the performance of that target may be determined. In an embodiment, the parameter may be the target coefficient. In another embodiment, the parameter may be stack sensitivity. Other parameters that may be of interest include overlay impact, aberration sensitivity and/or a process variation sensitivity that can be simulated and considered in target selection. In an embodiment, any parameter that characterizes target robustness against metrology tool variation may likewise be used.

In an embodiment, a proposed metrology target should pass a certain threshold at all process window conditions for the metrology target to be accepted.

For some, each, or all of the parameters, a ranking may be assigned to each target. In an embodiment, a particular parameter may be selected (e.g., by a user) to be the sole parameter of interest and the ranking will be based entirely on that parameter. In an embodiment, parameters may be combined, in a weighted form or in straightforward combination, by, e.g., user selection. In an embodiment, a multi-step filtering process (used alone or in combination with a ranking) in which a selected most important parameter acts as the first-applied filter, then one or more subsequent parameters are considered to refine the proposed metrology targets. The specific manner of combining or considering the various parameters may depend on the particular process being modeled. In an embodiment, a top 10% or top 20% ranking may qualify the metrology target for acceptance.

Thus, in an embodiment, there is provided a method of simulating the metrology target printability of various metrology target designs over the process window using a lithography model. For example, various representative points at the edge of the process window are selected and the metrology targets simulated. If a simulated metrology target yields a catastrophic error (e.g., one or more extra lines, one or more missing lines, resist collapse, minimum CD/space, etc.), that metrology target is discarded. The remaining metrology target designs are simulated using a metrology model at all process window conditions (e.g., to determine target coefficients for the respective remaining metrology target design). The metrology target designs are then qualified and may be accepted based on, for example, ranking and/or exceeding a threshold (e.g., for all process window conditions).

Consequently, there is provided a method of selecting metrology target designs over a lithographic process window. As long as a proposed metrology target design is evaluated not to suffer a catastrophic failure across the process window, one or more of its metrology performance indicators are simulated and used for metrology target selection.

In an embodiment, a method herein may enable wider and more accurate metrology target selection. Metrology targets may be evaluated based on metrology performance, rather than a tight lithography threshold (e.g., substrate CD change). Thus, those metrology target designs which might be filtered out based on, e.g., substrate CD change alone can still be evaluated and may even be selected.

While the target structures described herein are metrology targets specifically designed and formed for the purposes of measurement, in other embodiments, properties may be measured on targets which are functional parts of devices formed on the substrate. Many devices have regular, grating-like structures. The terms 'target', 'target grating' and 'target structure' as used herein do not require that the structure has been provided specifically for the measurement being performed.

While overlay targets in the form of gratings have been described, in an embodiment, other target types may be used such as box-in-box image based overlay targets.

While metrology targets to determine overlay have been primarily described, the metrology targets may be used to determine, in the alternative or additionally, one of more other characteristics, such as focus, dose, etc.

The metrology targets according to an embodiment may be defined using a data structure such as a pixel-based data structure or a polygon-based data structure. The polygon-based data structure may, for example, be described using GDSII data formats, which are rather common in the chip manufacturing industry. Still, any suitable data structure or data format may be used without departing from the scope of the embodiments. The metrology targets may be stored in a database from which a user may select the required metrology target for use in a particular semiconductor processing step. Such a database may comprise a single metrology target or a plurality of metrology targets selected according to the embodiment. The database may also comprise a plurality of metrology targets in which the database comprises additional information for each of the plurality of metrology targets. This additional information may, for example, comprise information related to a suitability or a quality of the metrology target for a specific lithographic process step and may even include suitability of a single metrology target to different lithographic process steps. The suitability of the metrology target may be expressed in a quality value or suitability value which may be used during a final selection process of selecting one metrology target from the database which is to be used for the specific lithographic process step.

In an embodiment, the computer readable medium may comprise instructions for activating at least some of the method steps using a connection to the computer readable medium from a remote computer or from a remote system. Such connection may, for example, be generated over a secure network or via a (secure) connection over the world-wide-web (internet). In this embodiment, users may, for example, log in from a remote location to use the computer readable medium for determining a suitability of a metrology target. The proposed metrology target may be provided by the remote computer. So the proposed metrology target which is to be simulated using models may be owned by a different entity or company compared to the models used during the simulation process. Subsequently, the resulting determined simulated parameter value to evaluate target quality may be provided back to the remote computer, for example, without leaving any residual details to excess the proposed metrology target or the simulation parameters used. In such an embodiment, a customer may acquire the option to run an assessment of individually proposed metrology targets without owning the software or having a copy of the software at its remote location. Such option may be obtained by, for example, a user agreement. A benefit of such user agreement may be that the models used in the simulations may always be the most recent and/or the most detailed models available without the need to locally update any software. Furthermore, by separating the model simulation and the proposed metrology target proposal, the details of the designed markers or the different layers used for the processing need not to be shared by the two companies. In association with the physical grating structures of the targets as realized on substrates and patterning devices, an embodiment may include a computer program containing one or more sequences of machine-readable instructions describing a method of designing a target, producing a target on a substrate, measuring a target on a substrate and/or analyzing measurements to obtain information about a lithographic process. This computer program may be executed for example within unit PU in the apparatus of FIGS. 3 and 4 and/or the control unit LACU of FIG. 2. There may also be provided a data storage medium (e.g., semiconductor memory, magnetic or optical disk) having such a computer program stored therein. Where an existing apparatus, for example of the type shown in FIGS. 1-4, is already in production and/or in use, an embodiment can be implemented by the provision of updated computer program products for causing a processor of the apparatus to perform a method as described herein.

An embodiment of the invention may take the form of a computer program containing one or more sequences of machine-readable instructions describing a method as disclosed herein, or a data storage medium (e.g., semiconductor memory, magnetic or optical disk) having such a computer program stored therein. Further, the machine readable instruction may be embodied in two or more computer programs. The two or more computer programs may be stored on one or more different memories and/or non-transitory data storage media. Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

The invention may further be described using the following clauses:

1. A method of selecting a metrology target for use on a substrate, the method comprising:
   performing a lithographic simulation for a plurality of points on a process window region for a proposed metrology target;
   performing a metrology simulation to determine a value for a parameter over the process window for the proposed metrology target if the proposed metrology target does not have a catastrophic error at any of the plurality of points; and
   using the resulting determined simulated parameter value to evaluate target quality.
2. The method of clause 1, comprising performing the lithographic simulation for a plurality of proposed metrology targets, performing the metrology simulation for the one or more of the proposed metrology targets that do not have a catastrophic error, and using the one or more resulting determined simulated parameters to evaluate target quality of the one or more of the proposed metrology targets.
3. The method of clause 2, wherein determined simulated parameter values are used to rank a plurality of proposed metrology targets.
4. The method of any of clauses 1 to 3, wherein performing the metrology simulation comprises determining values for a plurality of parameters over the process window and wherein using the resulting determined simulated parameter value comprises using the values for the plurality of determined simulated parameters to evaluate target quality.
5. The method of clause 4, wherein each simulated parameter is used in sequence to progressively filter a plurality of proposed metrology targets.
6. The method of clause 4, wherein each simulated parameter is used in weighted combination to rank a plurality of proposed metrology targets.
7. The method of any of clauses 1 to 6, wherein the lithographic simulation comprises an optical-resist simulation.
8. The method of any of clauses 1 to 7, wherein the metrology simulation comprises a diffraction-based overlay simulation.
9. The method of any of clauses 1 to 8, wherein the catastrophic error comprises at least one error selected from the group consisting of: bridging, necking between lines, resist collapse, one or more extra lines, one or more missing lines, excessive top loss, minimum critical dimension, and minimum line space.
10. The method of any of clauses 1 to 9, wherein the process window comprises a region in a dose/focus space over which a lithographic image parameter equals or surpasses a selected threshold.
11. A non-transitory computer readable medium encoded with machine executable instructions to perform a method of selecting a metrology target for use on a substrate, the method comprising:
    performing a lithographic simulation for a plurality of points on a process window region for a proposed metrology target;
    performing a metrology simulation to determine a value for a parameter over the process window for the proposed metrology target if the proposed metrology target does not have a catastrophic error at any of the plurality of points; and
    using the resulting determined simulated parameter value to evaluate target quality.
12. The computer readable medium of clause 11, wherein the method comprises performing the lithographic simulation for a plurality of proposed metrology targets, performing the metrology simulation for the one or more of the proposed metrology targets that do not have a catastrophic error, and using the one or more resulting determined simulated parameters to evaluate target quality of the one or more of the proposed metrology targets.

13. The computer readable medium of clause 12, wherein determined simulated parameter values are used to rank a plurality of proposed metrology targets.

14. The computer readable medium of any of clauses 11 to 13, wherein performing the metrology simulation comprises determining values for a plurality of parameters over the process window and wherein using the resulting determined simulated parameter value comprises using the values for the plurality of determined simulated parameters to evaluate target quality.

15. The computer readable medium of clause 14, wherein each simulated parameter is used in sequence to progressively filter a plurality of proposed metrology targets.

16. The computer readable medium of clause 14, wherein each simulated parameter is used in weighted combination to rank a plurality of proposed metrology targets.

17. The computer readable medium of any of clauses 11 to 16, wherein the metrology simulation comprises an optical metrology simulation.

18. The computer readable medium of clause 17 wherein the optical metrology simulation comprises a simulation of a diffraction based overlay metrology tool.

19. The computer readable medium of any of the clauses 11 to 17, wherein the machine executable instructions further comprise instructions for activating at least some of the method steps using a connection to the computer readable medium from a remote computer.

20. The computer readable medium of clause 19, wherein the connection with the remote computer is a secured connection.

21. The computer readable medium of any of the clauses 19 and 20, wherein the proposed metrology target is provided by the remote computer.

22. The computer readable medium of clause 21, wherein the method is further configured for providing the resulting determined simulated parameter value to evaluate target quality back to the remote computer.

23. A system to select a metrology target for use on a substrate, the system comprising:
a processing unit configured and arranged to:
perform a lithographic simulation for a plurality of points on a process window region for a proposed metrology target;
perform a metrology simulation to determine a value for a parameter over the process window for the proposed metrology target if the proposed metrology target does not have a catastrophic error at any of the plurality of points; and
use the resulting determined simulated parameter value to evaluate target quality.

24. A method, comprising:
evaluating a plurality of metrology target designs at a plurality of points of a lithographic process window for a catastrophic error;
for a plurality of metrology target designs that are evaluated not to suffer a catastrophic error at any of the plurality of points, determining a metrology performance indicator for each of the plurality of metrology target designs evaluated not to suffer a catastrophic error; and
providing an evaluation of the plurality of metrology target designs evaluated not to suffer a catastrophic error based on the metrology performance indicator.

25. A metrology target configured for being measured using a metrology measurement system, the metrology target being selected using the method of any of the clauses 1 to 10 and 24 or using the computer readable medium of any of the clauses 11 to 22.

26. The metrology target according to clause 25, wherein the metrology measurement system comprises a diffraction based measurement system.

27. A metrology measurement system using the metrology target selected using the method of any of the clauses 1 to 10 and 24 or using the computer readable medium of any of the clauses 11 to 22.

28. A metrology measurement system configured for measuring the metrology target selected using the method of any of the clauses 1 to 10 and 24 or using the computer readable medium of any of the clauses 11 to 22.

29. A substrate comprising the metrology target selected using the method of any of the clauses 1 to 10 and 24 or using the computer readable medium of any of the clauses 11 to 22.

30. The substrate according to clause 29, wherein the substrate is a wafer comprising at least some of the layers of an integrated circuit.

31. A lithographic imaging apparatus configured for imaging a metrology target selected using the method of any of the clauses 1 to 10 and 24 or using the computer readable medium of any of the clauses 11 to 22.

32. A lithographic imaging apparatus configured for imaging a metrology target according to any of the clauses 25 and 26.

33. A data structure representing the metrology target selected using the method of any of the clauses 1 to 10 and 24 or using the computer readable medium of any of the clauses 11 to 22.

34. A data structure representing the metrology target according to any of the clauses 25 and 26.

35. A database comprising the metrology target selected using the method of any of the clauses 1 to 10 and 24 or using the computer readable medium of any of the clauses 11 to 22.

36. The database according to clause 35, wherein the database comprises a plurality of metrology targets, each selected using the method of any of the clauses 1 to 10 and 24 or using the computer readable medium of any of the clauses 11 to 22.

37. A database comprising the data structure according to any of the clauses 33 and 34.

38. The database according to clause 37, wherein the database comprises a plurality of data structures each representing the metrology target selected using the method of any of the clauses 1 to 10 and 24 or using the computer readable medium of any of the clauses 11 to 22.

39. The database according to any of the clauses 35 to 38, wherein the database comprises a suitability value associated with the metrology target, the suitability value indicating a suitability of the metrology target for a lithographic process step.

40. A data carrier comprising the data structure according to any of the clauses 33 and 34 and/or comprising the database according to any of the clauses 35 to 39.

41. The system according to clause 23, wherein the system comprises an connection to a network for communicating with a remote system.

42. The system according to clause 41, wherein the remote system is configured for providing the proposed metrology target.

43. The system according to clause 41 or 42, wherein the system is configured for using the connection to the remote system for transmitting the simulated parameter value and/or the target quality to the remote system.

44. Use of the metrology target according to any of the clauses 25 and 26, wherein the metrology target is used for determining a positioning of one layer to another layer on the substrate, and/or for determining an alignment of a layer on the substrate relative to the projection optics of a lithographic imaging apparatus, and/or for determining a critical dimension of a structure on the substrate.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method of selecting a metrology target for use on a substrate, the method comprising:
    performing a lithographic simulation for a plurality of points on a process window region for a plurality of proposed metrology targets;
    determining the presence or absence of a catastrophic error at each of the plurality of points for each of the proposed metrology targets;
    performing a metrology simulation to determine a value for a parameter over the process window only for each proposed metrology target that does not have a catastrophic error at any of the plurality of points; and
    using the resulting determined simulated parameter value to evaluate target quality of the one or more of the proposed metrology targets.

2. The method of claim 1, wherein determined simulated parameter values are used to rank a plurality of proposed metrology targets.

3. The method of claim 1, wherein performing the metrology simulation comprises determining values for a plurality of parameters over the process window and wherein using the resulting determined simulated parameter value comprises using the values for the plurality of determined simulated parameters to evaluate target quality.

4. The method of claim 3, wherein each simulated parameter is used in sequence to progressively filter a plurality of proposed metrology targets.

5. The method of claim 3, wherein each simulated parameter is used in weighted combination to rank a plurality of proposed metrology targets.

6. The method of claim 1, wherein the lithographic simulation comprises an optical-resist simulation.

7. The method of claim 1, wherein the metrology simulation comprises a diffraction-based overlay simulation.

8. The method of claim 1, wherein the catastrophic error comprises at least one error selected from the group consisting of: bridging, necking between lines, resist collapse, one or more extra lines, one or more missing lines, excessive top loss, minimum critical dimension, and minimum line space.

9. The method of claim 1, wherein the process window comprises a region in a dose/focus space over which a lithographic image parameter equals or surpasses a selected threshold.

10. A non-transitory computer readable medium encoded with machine executable instructions to perform a method of selecting a metrology target for use on a substrate, the method comprising:
    performing a lithographic simulation for a plurality of points on a process window region for a plurality of proposed metrology targets;
    determining the presence or absence of a catastrophic error at each of the plurality of points for each of the proposed metrology targets;
    performing a metrology simulation to determine a value for a parameter over the process window only for each proposed metrology target that does not have a catastrophic error at any of the plurality of points; and using the resulting determined simulated parameter value to evaluate target quality of the one or more of the proposed metrology targets.

11. The computer readable medium of claim 10, wherein determined simulated parameter values are used to rank a plurality of proposed metrology targets.

12. The computer readable medium of claim 10, wherein performing the metrology simulation comprises determining values for a plurality of parameters over the process window and wherein using the resulting determined simulated parameter value comprises using the values for the plurality of determined simulated parameters to evaluate target quality.

13. The computer readable medium of claim 12, wherein each simulated parameter is used in sequence to progressively filter a plurality of proposed metrology targets.

14. The computer readable medium of claim 12, wherein each simulated parameter is used in weighted combination to rank a plurality of proposed metrology targets.

15. The computer readable medium of claim 10, wherein the metrology simulation comprises an optical metrology simulation.

16. The computer readable medium of claim 15 wherein the optical metrology simulation comprises a simulation of a diffraction based overlay metrology tool.

17. A system to select a metrology target for use on a substrate, the system comprising:
a processing unit configured and arranged to:
perform a lithographic simulation for a plurality of points on a process window region for a plurality of proposed metrology targets;
determine the presence or absence of a catastrophic error at each of the plurality of points for each of the proposed metrology targets;
perform a metrology simulation to determine a value for a parameter over the process window only for each proposed metrology target that does not have a catastrophic error at any of the plurality of points; and
use the resulting determined simulated parameter value to evaluate target quality of the one or more of the proposed metrology targets.

18. A method, comprising:
evaluating a plurality of metrology target designs at a plurality of points of a lithographic process window for a catastrophic error;
for a plurality of metrology target designs that are evaluated not to suffer a catastrophic error at any of the plurality of points, determining a metrology performance indicator for each of the plurality of metrology target designs evaluated not to suffer a catastrophic error; and
providing an evaluation of the plurality of metrology target designs evaluated not to suffer a catastrophic error based on the metrology performance indicator.

* * * * *